United States Patent
Cideciyan et al.

(10) Patent No.: US 7,694,205 B2
(45) Date of Patent: Apr. 6, 2010

(54) METHOD AND APPARATUS FOR PROVIDING A READ CHANNEL HAVING COMBINED PARITY AND NON-PARITY POST PROCESSING

(75) Inventors: Roy D. Cideciyan, Rueschlikon (CH); Ajay Dholakia, Gattikon (CH); Evangelos S. Eleftheriou, Zurich (CH); Richard L. Galbraith, Rochester, MN (US); Weldon M. Hanson, Rochester, MN (US); Thomas Mittelholzer, Zurich (CH); Travis R. Oenning, Rochester, MN (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 994 days.

(21) Appl. No.: 11/067,851

(22) Filed: Feb. 28, 2005

(65) Prior Publication Data
US 2006/0195775 A1    Aug. 31, 2006

(51) Int. Cl.
G11C 29/00     (2006.01)
H03M 13/00     (2006.01)

(52) U.S. Cl. .................. 714/769; 714/780; 714/785
(58) Field of Classification Search ............... 714/769, 714/780, 785
See application file for complete search history.

(56) References Cited

U.S. PATENT DOCUMENTS

| | | | |
|---|---|---|---|
| 6,185,173 B1 * | 2/2001 | Livingston et al. | 369/59.21 |
| 6,185,175 B1 * | 2/2001 | Zook | 369/53.35 |
| 6,516,443 B1 | 2/2003 | Zook | |
| 6,530,060 B1 | 3/2003 | Vis et al. | |
| 6,587,987 B1 | 7/2003 | Vasic et al. | |
| 6,931,585 B1 * | 8/2005 | Burd et al. | 714/795 |
| 6,986,098 B2 * | 1/2006 | Poeppelman et al. | 714/807 |

* cited by examiner

*Primary Examiner*—Joseph D Torres
(74) *Attorney, Agent, or Firm*—Merchant & Gould

(57) ABSTRACT

A method and apparatus for providing a read channel having combined parity and non-parity post processing is disclosed. A post-processor combines parity and non-parity post processing to make both parity and non-parity corrections so that error events that cannot be detected by parity may be corrected. Non-parity detectable error events are only kept for consideration if their likelihood is above a set threshold.

15 Claims, 10 Drawing Sheets

- Which error events can be detected with single bit parity?

| | | | | | |
|---|---|---|---|---|---|
| + | | | | | detectable — 710 |
| + | − | | | | not detectable |
| + | − | + | | | detectable |
| + | − | + | − | | not detectable — 712 |
| + | − | + | − | + | detectable |
| + | 0 | + | | | not detectable — 714 |
| + | 0 | 0 | + | | not detectable |
| + | 0 | 0 | 0 | + | not detectable |

800

|   |   |   |   |   |   |   | + | correctable |
|---|---|---|---|---|---|---|---|---|
|   |   |   | − | − | + |   |   | correctable |
|   + | + | + | + | + | 0 | 0 |   | correctable |
|   |   | − | − | − | − | 0 | 0 | correctable |
|   |   |   |   |   | 0 | 0 | 0 | correctable |
|   |   |   |   |   |   | 0 | 0 | correctable |
|   |   |   |   |   |   |   | 0 | correctable |
| + | + | + | + | + | + | + | + | correctable |

Fig. 8

METHOD AND APPARATUS FOR PROVIDING A READ CHANNEL HAVING COMBINED PARITY AND NON-PARITY POST PROCESSING

BACKGROUND OF THE INVENTION

1. Field of the Invention

This invention relates in general to signals read from a data storage medium, and more particularly to a method and apparatus for providing a read channel having combined parity and non-parity post processing.

2. Description of Related Art

Recently developed data storage devices, such as magnetic disk drive devices (i.e., hard disk drives), have increased storage capacity and increased data access speed. With these advantages, magnetic disk drive devices have become widely used as auxiliary memory devices for computer systems. More generally, developments in pulse communications related to these improvements in disk drive technology have recently provided increased speed and reliability in a wide range of pulse communications systems.

The primary features of a magnetic disk drive device that affect storage capacity and access speed are the head, the recording medium, the servo mechanism, the signal processing technique used in the read/write channel, and the like. Among these, signal processing techniques utilizing PRML (Partial Response Maximum Likelihood) detection have greatly contributed to the increased storage capacities and high access speeds seen in modern magnetic disk drive devices.

Each read/write head generates or senses electromagnetic fields or magnetic encodings on the magnetic disk as areas of magnetic flux. The presence or absence of flux reversals in the electromagnetic fields represents the data stored on the magnetic disk. A flux reversal is a change in the magnetic flux on contiguous areas of the magnetic disk. The presence or absence of magnetic flux reversals correspond to binary 1's and 0's of a diagnostic input signal.

To "write" data onto a magnetic disk, electronic components receive data from a host device and translate the data into magnetic encodings. The head transfers the magnetic encodings onto a portion of the magnetic disk.

To "read" data from the magnetic disk, the head is positioned adjacent to the portion of the magnetic disk having the desired magnetic encodings. The head senses and transfers the magnetic encodings from the magnetic disk. The electronic components translate the magnetic encodings into the data, which is transferred to the host device. The host device may be a personal computer or other electronic equipment. The electronic components may apply error detection and correction algorithms to ensure accurate storage and retrieval of data from the magnetic disk. To improve data storage densities on disk drives, magneto resistive and inductive read/write heads have been developed with increased sensitivity to sense smaller amplitude magnetic signals and with increased signal discrimination.

The primary function of the disk drive read channel is to reliably recover data from a noise contaminated read back signal. State of the art detection architectures equalize to a fixed length partial response target and then use the Viterbi algorithm for detection. A read channel circuit includes components for initial processing of the analog read signal generated by the read/write head of the device. This processing typically includes automatic gain control (AGC) amplification, filtering, and equalization, as well as analog-to-digital conversion.

It is also common to use some type of post-processing after the Viterbi algorithm to further improve error rate. Post processor algorithms typically generate reliability information for dominant error events and use this information in conjunction with prior knowledge of parity constraints on blocks of the encoded data. In other cases the reliability generation algorithm may be good enough that it does not need to be used in conjunction with parity information. This may be the case, for example, when using a longer partial response target to generate reliability information than was used by the Viterbi algorithm in detection.

Written data bits, when read back, can be thought of as being filtered by some response and corrupted with noise. This signal is then equalized such that the combined effect of filtering and equalization is some desired target response. The Viterbi Algorithm is then used to obtain an estimate of the data sequence. This estimate is then filtered by the target response to obtain a noiseless version of the equalizer output that is then subtracted from the noisy equalizer output and filtered by the time reversed target response.

The time-reversed filter is also referred to as the matched filter. The matched filter output is then input to each of N different error event filters. An offset term specific to each error event filter output is then added to generate a final reliability number associated with each error event. This is done each bit time. The reliabilities are then sent to a selection algorithm block. The selection block uses a specific algorithm for deciding on an error sequence. This error sequence can then be used to improve the reliability of the original decisions made at the Viterbi Algorithm output.

Current selection algorithms generally operate according to two forms. For example, the selection algorithms may incorporate prior knowledge of parity constraints on blocks of the encoded $a_k$ data steam or, in the case of a windowed selection algorithm, parity constraints are not relied upon for determining the error sequence.

A codeword size is fixed ahead of time. A typical size is somewhere in the range of 30 to 110 bits. Throughout the processing of each bit in a codeword a list of the predetermined number of most likely error events is kept along with the associated error event type and location. This list is reset at the beginning of each codeword. At the same time the parity syndrome associated with the detected codeword bits is computed and is available at the end of the codeword. At the end of the codeword, a correction is made based on the most likely single or non-overlapping pairs of error events from the final list that fixes parity. If none of these choices fixes the parity no correction is made.

For example, when parity is used to correct error events, a post-processor may determine a next closest pattern, in Euclidian distance, that fixes parity using a list of error events. However, the number of error events that can be corrected in this matter is limited based upon the number of bits of parity that are used. When parity is not used to correct for error events, a post-processor can determine if using an error event will improve an Euclidian distance fit based on using a longer target than the target used in the Viterbi detector. The post-processor biases error event likelihoods based on a number of transitions. Still, each of these two forms of selection algorithms consider only those error events that resulted in a non-zero parity syndrome. Thus, the error rate performance is less than optimal.

It can be seen that there is a need for a method and apparatus for providing a read channel having combined parity and non-parity post processing.

SUMMARY OF THE INVENTION

To overcome the limitations in the prior art described above, and to overcome other limitations that will become apparent upon reading and understanding the present specification, the present invention discloses a method and apparatus for providing a read channel having combined parity and non-parity post processing.

The present invention solves the above-described problems by providing a post-processor that combines parity and non-parity post processing to make both parity and non-parity corrections so that error events that cannot be detected by parity may be corrected. Non-parity detectable error events are only kept for consideration if their likelihood is above a set threshold.

A post-processor for selecting an error sequence in accordance with an embodiment of the present invention includes memory for storing data therein and a processor, coupled to the memory, the processor being configured for computing, for each processed bit of a codeword, reliabilities associated with each error event, wherein the reliabilities are based on parity and non-parity error events, computing parity syndromes associated with the codeword bits, maintaining a list of most likely error events including parity events and non-parity events meeting a predetermined criteria based on the computed reliabilities and parity syndromes and selecting an error event having the highest reliability from the list of most likely error events for use in correcting for detected errors.

In another embodiment of the present invention, a method for selecting an error sequence is provided. The method includes, for each processed bit of a codeword, computing reliabilities associated with each error event, wherein the reliabilities are based on parity and non-parity error events, computing parity syndromes associated with the codeword bits, based on the computed reliabilities and parity syndromes, maintaining a list of most likely error events by prioritzing parity error events and non-parity error events meeting a predetermined criteria and selecting an error event having the highest reliability from the list of most likely error events for use in correcting for detected errors.

In another embodiment of the present invention, a magnetic storage device is provided. The magnetic storage device includes a magnetic storage medium for recording data thereon, a motor for moving the magnetic storage medium, a head for reading and writing data on the magnetic storage medium, an actuator for positioning the head relative to the magnetic storage medium and a data channel for processing encoded signals form the magnetic storage medium, the data channel comprising a post-processor for selecting an error sequence, the post-processor being configured for computing, for each processed bit of a codeword, reliabilities associated with each error event, wherein the reliabilities are based on parity and non-parity error events, computing parity syndromes associated with the codeword bits, maintaining a list of most likely error events including parity events and non-parity events meeting a predetermined criteria based on the computed reliabilities and parity syndromes and selecting an error event having the highest reliability from the list of most likely error events for use in correcting for detected errors.

In another embodiment of the present invention, a read channel is provided. The read channel includes an adaptive equalizer for equalizing a received data sequence to a desired target response, a Viterbi detector, coupled to the equalizer, for obtaining an estimate of the data sequence and a post-processor, coupled to the Viterbi detector, for selecting an error sequence, the post-processor being configured for computing, for each processed bit of a codeword, reliabilities associated with each error event, wherein the reliabilities are based on parity and non-parity error events, computing parity syndromes associated with the codeword bits, maintaining a list of most likely error events including parity events and non-parity events meeting a predetermined criteria based on the computed reliabilities and parity syndromes and selecting an error event having the highest reliability from the list of most likely error events for use in correcting for detected errors.

In another embodiment of the present invention, another post-processor for selecting an error sequence is provided. This post-processor includes means for storing data therein and means for processing, coupled to the means for storing data, the means for processing being configured for computing, for each processed bit of a codeword, reliabilities associated with each error event, wherein the reliabilities are based on parity and non-parity error events, computing parity syndromes associated with the codeword bits, maintaining a list of most likely error events including parity events and non-parity events meeting a predetermined criteria based on the computed reliabilities and parity syndromes and selecting an error event having the highest reliability from the list of most likely error events for use in correcting for detected errors.

In another embodiment of the present invention, another magnetic storage device is provided. This magnetic storage device includes means for recording data thereon, means for moving the means for recording data, means for reading and writing data on the means for recording data, means, coupled to the means for reading and writing, for positioning the means for reading and writing relative to the means for storing data and means for computing, for each processed bit of a codeword, reliabilities associated with each error event, wherein the reliabilities are based on parity and non-parity error events, computing parity syndromes associated with the codeword bits, maintaining a list of most likely error events including parity events and non-parity events meeting a predetermined criteria based on the computed reliabilities and parity syndromes and selecting an error event having the highest reliability from the list of most likely error events for use in correcting for detected errors.

In another embodiment of the present invention, another read channel is provided. This read channel includes means for equalizing a received data sequence to a desired target response, means, coupled to the means for equalizing, for obtaining an estimate of the data sequence and means, coupled to the for obtaining an estimate of the data sequence, for computing, for each processed bit of a codeword, reliabilities associated with each error event, wherein the reliabilities are based on parity and non-parity error events, computing parity syndromes associated with the codeword bits, maintaining a list of most likely error events including parity events and non-parity events meeting a predetermined criteria based on the computed reliabilities and parity syndromes and selecting an error event having the highest reliability from the list of most likely error events for use in correcting for detected errors.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 8 shows a list of error events that are correctable without using parity. However, the lack of parity can decrease the reliability of computed error events;

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method and apparatus for providing a read channel having combined parity and non-parity post processing. A post-processor combines parity and non-parity post processing to make both parity and non-parity corrections so that error events that cannot be detected by parity may be corrected. Non-parity detectable error events are only kept for consideration if their likelihood is above a set threshold.

Figure 1:
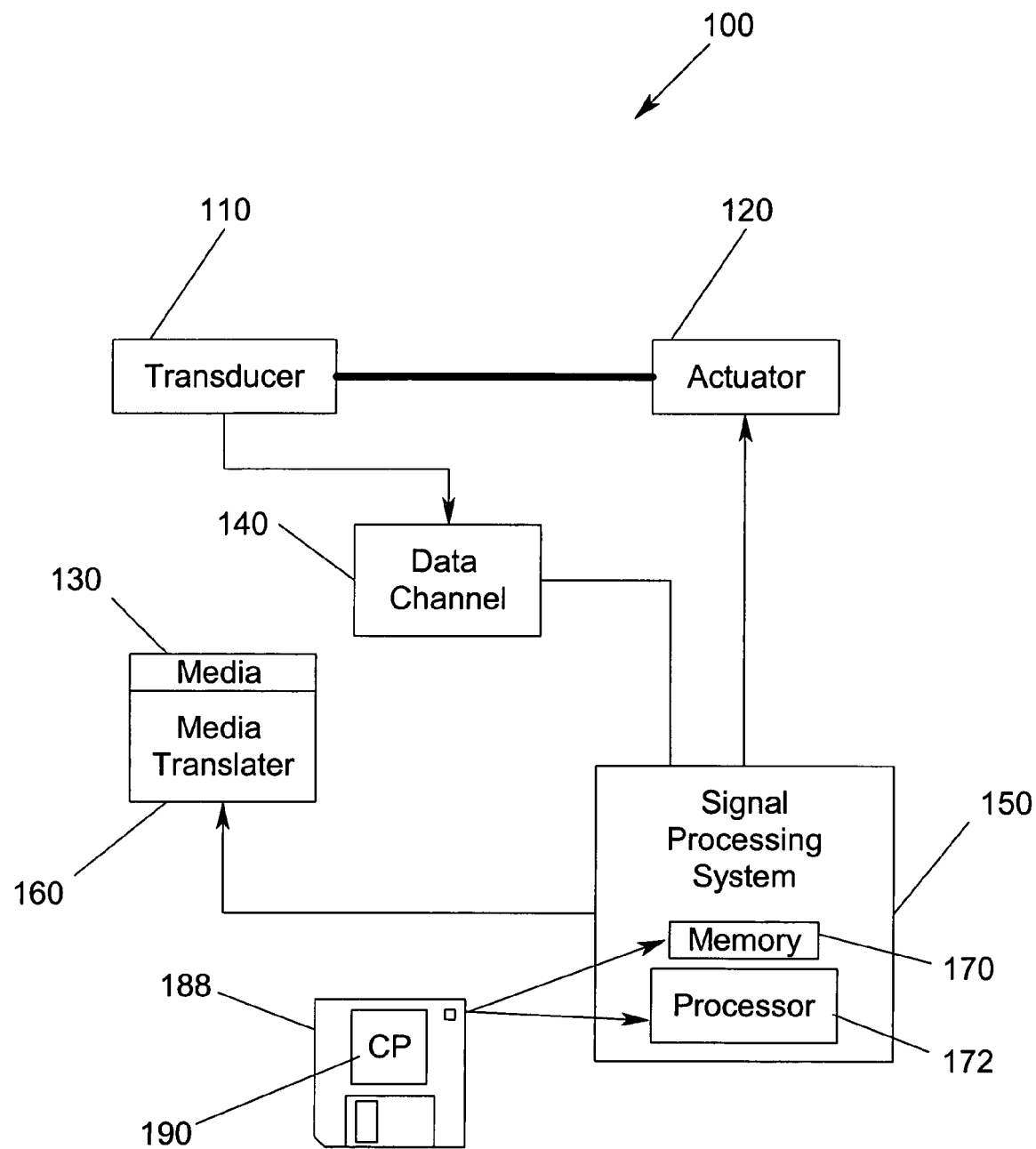
FIG. 1 illustrates a storage system according to an embodiment of the present invention.

FIG. 1 illustrates a storage system 100 according to an embodiment of the present invention. In FIG. 1, a transducer 110 is under control of an actuator 120. The actuator 120 controls the position of the transducer 110. The transducer 110 writes and reads data on magnetic media 130. The read/write signals are passed to a data channel 140. A signal processor system 150 controls the actuator 120 and processes the signals of the data channel 140. Signal processor system 150 includes processor 172 and memory 170. In addition, a media translator 160 is controlled by the signal processor system 150 to cause the magnetic media 130 to move relative to the transducer 110. Nevertheless, the present invention is not meant to be limited to a particular type of storage system 100 or to the type of media 130 used in the storage system 100. A computer program 190 expressing the processes embodied on the removable data storage devices 188 may be loaded into the memory 170 to configure the processor 172 for execution.

Figure 2:
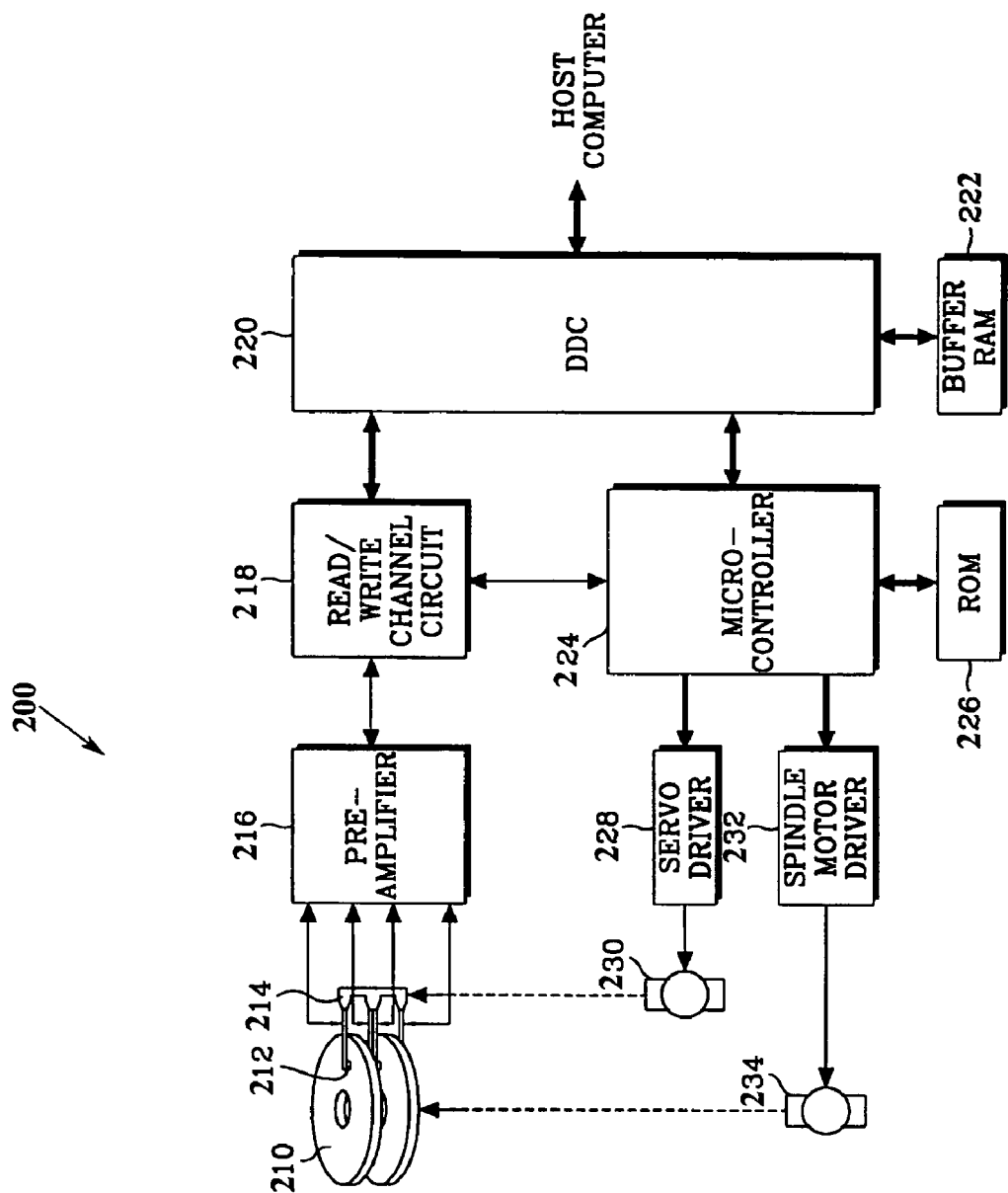
FIG. 2 is a block diagram of a magnetic disk drive device according to an embodiment of the present invention.

FIG. 2 is a block diagram of a magnetic disk drive device 200 according to an embodiment of the present invention. In FIG. 2, disks 210 are rotated by a spindle motor 234, and heads 212 are positioned at surfaces of disks 210. Heads 212 are mounted on corresponding servo arms that extend from an E-shaped block assembly 214 to disks 210. Block assembly 214 has an associated rotary voice coil actuator 230 that moves block assembly 214 and thereby changes to positions of heads 212 for reading data from or writing data to a specified position on one or more disks 210.

A pre-amplifier 216 pre-amplifies a signal picked up by heads 212 and thereby provides read/write channel circuit 218 with an amplified signal during a reading operation. During a write operation, pre-amplifier 216 transfers an encoded write data signal from the read/write channel circuit 218 to heads 212. In a read operation, read/write channel circuit 218 detects a data pulse from a read signal provided by pre-amplifier 216 and decodes the data pulse. Read/write channel circuit 218 transfers the decoded data pulse to a disk data controller (DDC) 220. Furthermore, read/write channel circuit 218 also decodes write data received from the DDC 220 and provides the decoded data to pre-amplifier 216.

DDC 220 both writes data received from a host computer (not shown) onto disks 210, through read/write channel circuit 218 and pre-amplifier 216, and transfers read data from disks 210 to the host computer. DDC 220 also interfaces between the host computer and a microcontroller 224. A buffer RAM (Random Access Memory) 222 temporarily stores data transferred between DDC 220 and the host computer, microcontroller 224, and read/write channel circuit 218. Microcontroller 224 controls track seeking and track following functions in response to read and write commands from the host computer.

A ROM (Read Only Memory) 226 stores a control program for microcontroller 224 as well as various setting values. A servo driver 228 generates a driving current for driving actuator 230 in response to a control signal, generated from microcontroller 224 that provides control of the position of heads 212. The driving current is applied to a voice coil of actuator 230. Actuator 230 positions heads 212 relative to disks 210 in accordance with the direction and amount of the driving current supplied from servo driver 228. A spindle motor driver 232 drives spindle motor 234, which rotates disks 210, in accordance with a control value generated from microcontroller 224 for controlling disks 210.

Figure 3:
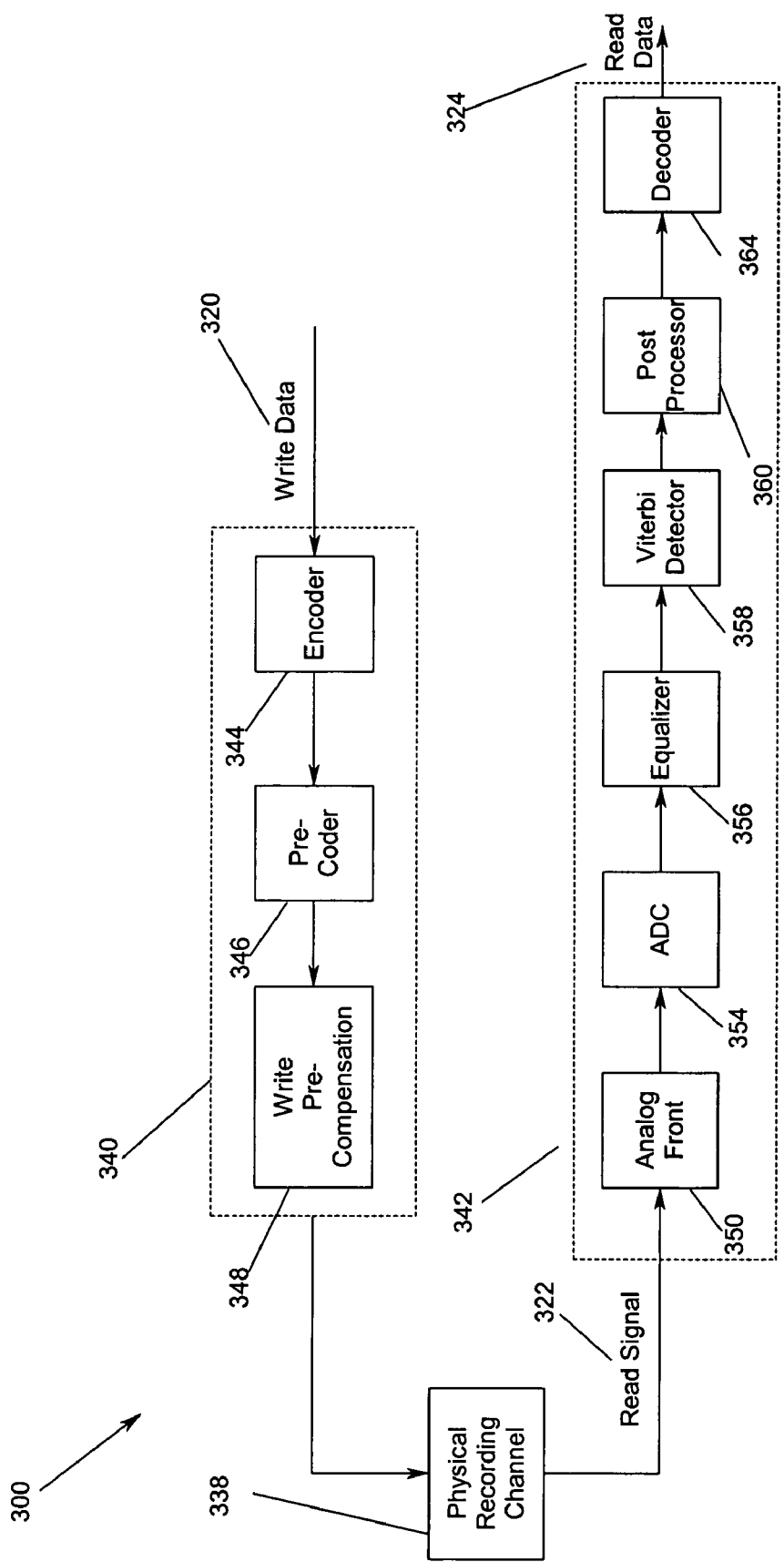
FIG. 3 is a block diagram of a read/write channel circuit of FIG. 2.

FIG. 3 is a block diagram of a read/write channel circuit 300 of FIG. 2. In FIG. 3, the read/write channel circuit 300 includes a physical recording channel 338 having a read/write means and a recording medium, a write channel circuit 340 for writing data onto the recording medium, and a read channel circuit 342 for reading data from the recording medium. Write channel circuit 340 is composed of an encoder 344, a pre-decoder 346, and a write compensator 348. Read channel circuit 342 includes an analog front end 350, an analog-to-digital converter (ADC) 354, an equalizer 356, a Viterbi detector 358, a post-processor 360 and a decoder 364.

In operation, encoder 344 encodes write data 320, input to be written onto the recording medium, into a predetermined code. For example, an RLL (Run Length Limited) code, in which the number of adjacent zeros must remain between specified maximum and minimum values, is commonly used for this predetermined code. However, the present invention is not meant to be limited to RLL and other coding may be used. Pre-decoder 346 is included to prevent error propagation. Write compensator 348 reduces non-linear influences arising from the read/write head. However, because the response of the actual recording channel does not exactly coincide with this transfer function, some subsequent equalization is always required.

Analog front end 350 amplifies an analog signal 322 read from the disk. The signal output from the analog front end 350 is converted into a discrete digital signal by analog-to-digital (A/D) converter 354. The resulting digital signal is then applied to equalizer 356, which adaptively controls inter-symbol interference (ISI) to generate desired waveforms. Viterbi detector 358 receives the equalized signal output from equalizer 356. The post processor 360 computes an error metric relative to a difference between the sequence of expected sample values that would have been generated in a noiseless system and the actual sample values output by the channel. The post processor 360 evaluates the filtered sample errors (noise) to detect and correct errors and is guided by an error syndrome generated from an error detection channel code.

When the error syndrome indicates an error is present, the error metrics assigned to the symbols in the preliminary sequence are evaluated to determine the most likely error event to have caused the error. The reliability values are evaluated by the post-processor 360 using a combined parity and non-parity process. For each possible input sequence, the post-processor 360 computes an error metric relative to a difference between the sequence of expected sample values that would have been generated in a noiseless system and the actual sample values output by the channel. For instance, a Euclidean metric may be computed as the accumulated square difference between the expected and actual sample values. The input sequence that generates the smallest Euclidean metric is identified by the post-processor 360 as the most likely sequence to have created the actual sample values. The sequence is therefore selected by the post-processor 360 as the output. Thus, the post processor evaluates the filtered sample errors (noise) to detect and correct errors. Decoder 364 decodes the encoded data output from Viterbi detector 358 to generate the final read data 324.

Figure 4:
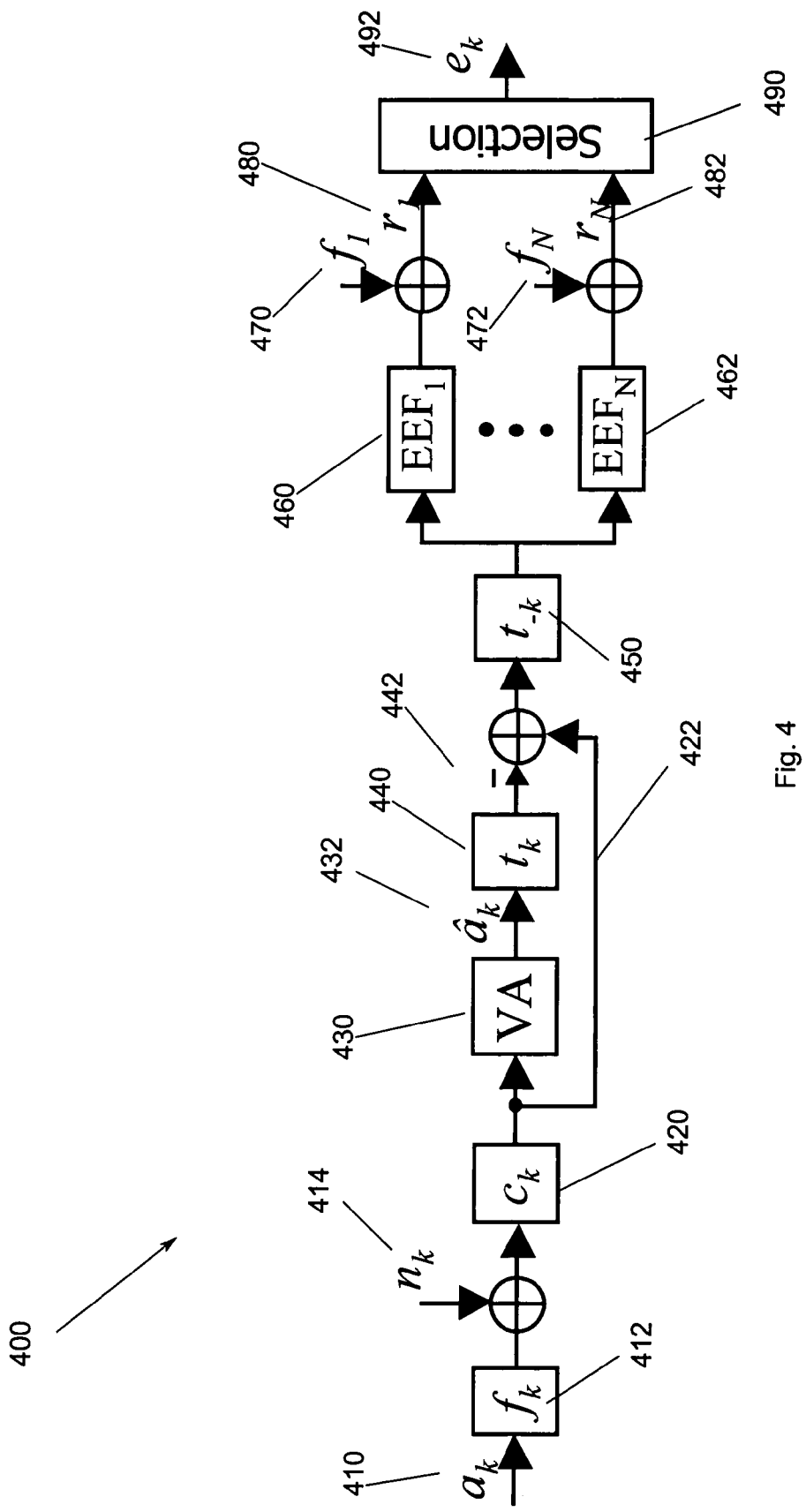
FIG. 4 is a block diagram of a read channel according to an embodiment of the present invention.

FIG. 4 is a block diagram of a read channel 400 according to an embodiment of the present invention. Written data bits, $a_k$ 410, when read back, can be thought of as being filtered by some response $f_k$ 412, such as inter-symbol interference. The filtered signal is then corrupted with noise $n_k$ 414. This signal is then equalized by equalizer $c_k$ 420, such that the combined effect of $f_k$ 412 and $c_k$ 420 is some desired target response given by $t_k$. The Viterbi algorithm 430 is then used to obtain an estimate $\hat{a}_k$ 432 of the data sequence $a_k$ 410. Estimate $\hat{a}_k$ 432 is then filtered by the target response, $t_k$ 440, to obtain a noiseless version of the equalizer output that is then subtracted 442 from the noisy equalizer output 422 and filtered by the time reversed target response, $t_{-k}$ 450. The time-reversed filter, $t_{-k}$ 450, is also referred to as the matched filter. The matched filter output is then input to each of N different error event filters, $EEF_1, \ldots EEF_N$ 460, 462.

An offset term, $f_1, \ldots, f_N$ 470, 472, that specific to each output of the error event filters 460, 462 is then added to generate a final reliability number, $r_1, \ldots, r_N$ 480, 482, which is associated with each error event. The reliabilities 480, 482 are then sent to a selection algorithm block 490. The selection block 490 uses a specific algorithm for deciding on an error sequence $e_k$ 492.

The error sequence $e_k$ 492, is then used to improve the reliability of the original decisions made at the Viterbi algorithm 430. The error event filters 460, 462 may incorporate an additional filtering component common across all the filters. The effect of such additional filtering provides is a target that may be longer than the original. Post-processing according to the present invention provides a selector 490 that combines parity and non-parity post processing.

Figure 5:
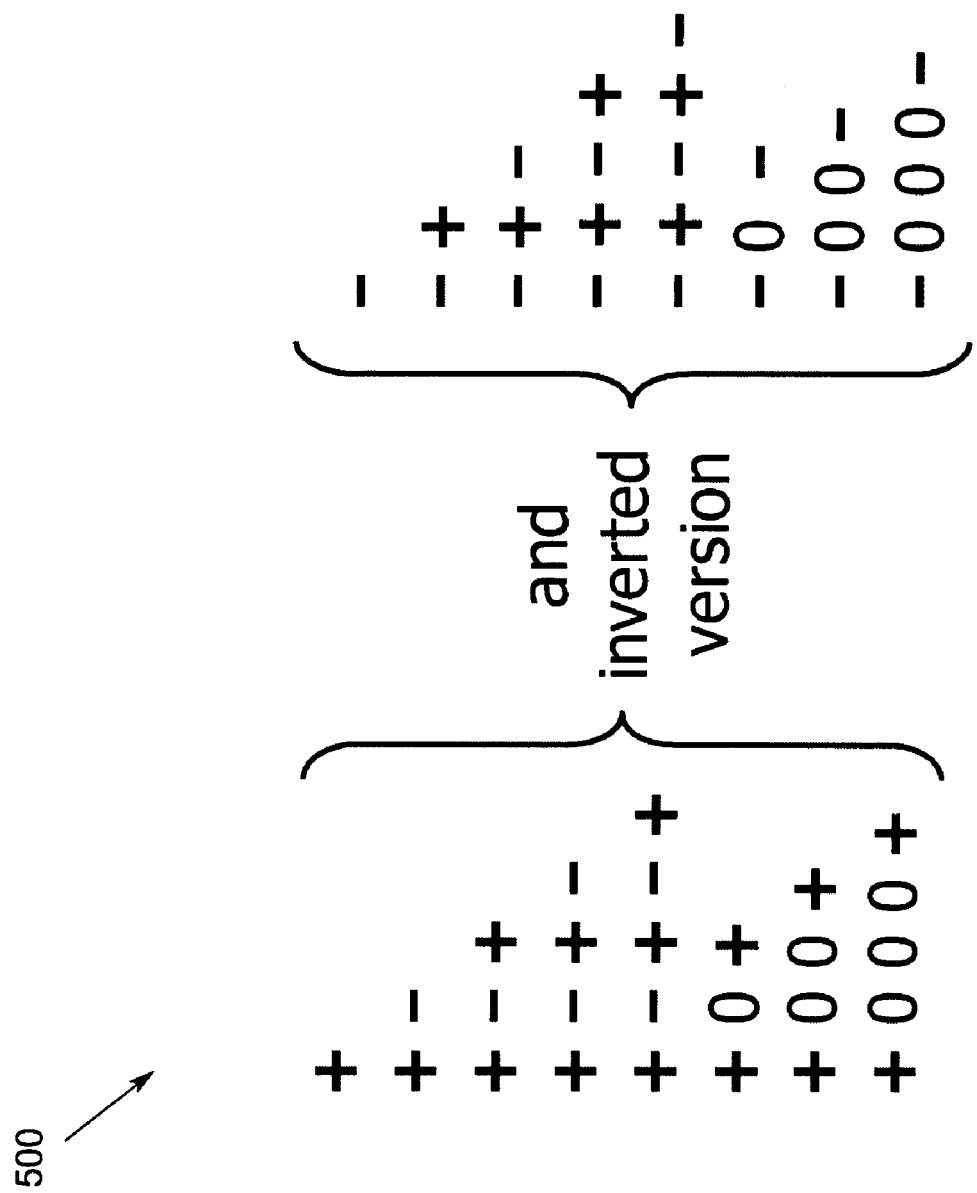
FIG. 5 illustrates common error events in magnetic recording.

FIG. 5 illustrates common error events 500 in magnetic recording. In FIG. 5, a shorthand vector notation is used to represent error events, where $\{+; 0; -\}$ denote $a_n - \hat{a}_k = +1; 0, -1$. The same notation will be used throughout.

Figure 6:
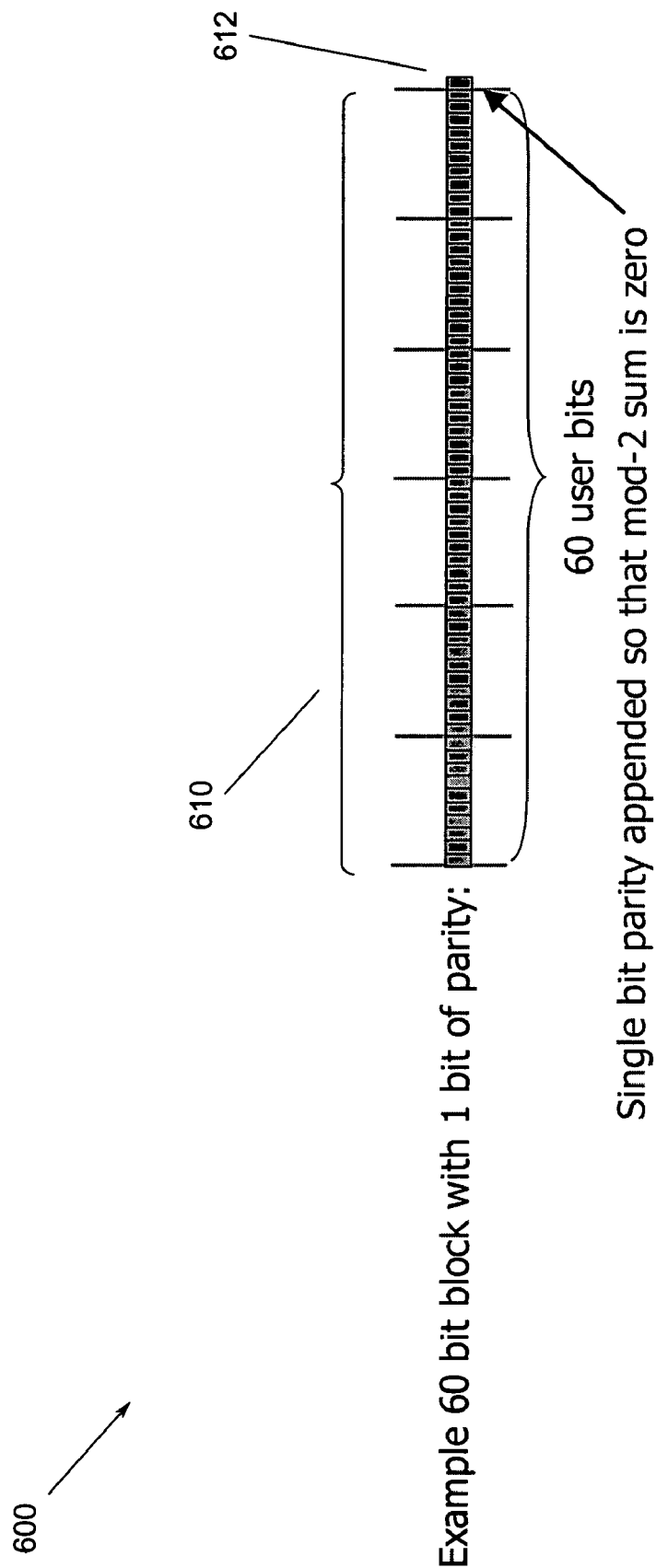
FIG. 6 illustrates a bit block with parity that may be used to correct for error events.
Figure 7:
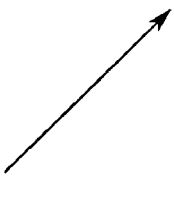
FIG. 7 is a list of detectable error events showing which error events may be detected using the 1 bit of parity shown in FIG. 6.

FIG. 6 illustrates a bit block with parity 600 that may be used to correct for error events. In FIG. 6, the bit block is a 60 bit block 610 with 1 bit of parity 612. The single bit parity 612 is appended so that the modulo-2 sum is zero. FIG. 7 is a list of detectable error events 700 showing which error events may be detected using the 1 bit of parity 612 shown in FIG. 6. Given a parity error, a post processor determines the next closest pattern, in Euclidean distance, that fixes parity using a list of error events. For the bit block having 1 bit parity, only 3 error events 710, 712, 714 and their inverses are correctable.

Another method for correcting error events is to use longer partial response target to generate reliability information than was used by the Viterbi algorithm in detection. A post-processor can determine if using an error event will improve Euclidean distance fit based on using a longer target than the target used in the Viterbi detector. The post processor may bias error event likelihoods based on the number of transitions. In such a case, the reliability generation algorithm may be good enough that it does not need to be used in conjunction with parity information. FIG. 8 shows a list of error events 800 that are correctable without using parity. However, the lack of parity can decrease the reliability of computed error events.

Figure 9:
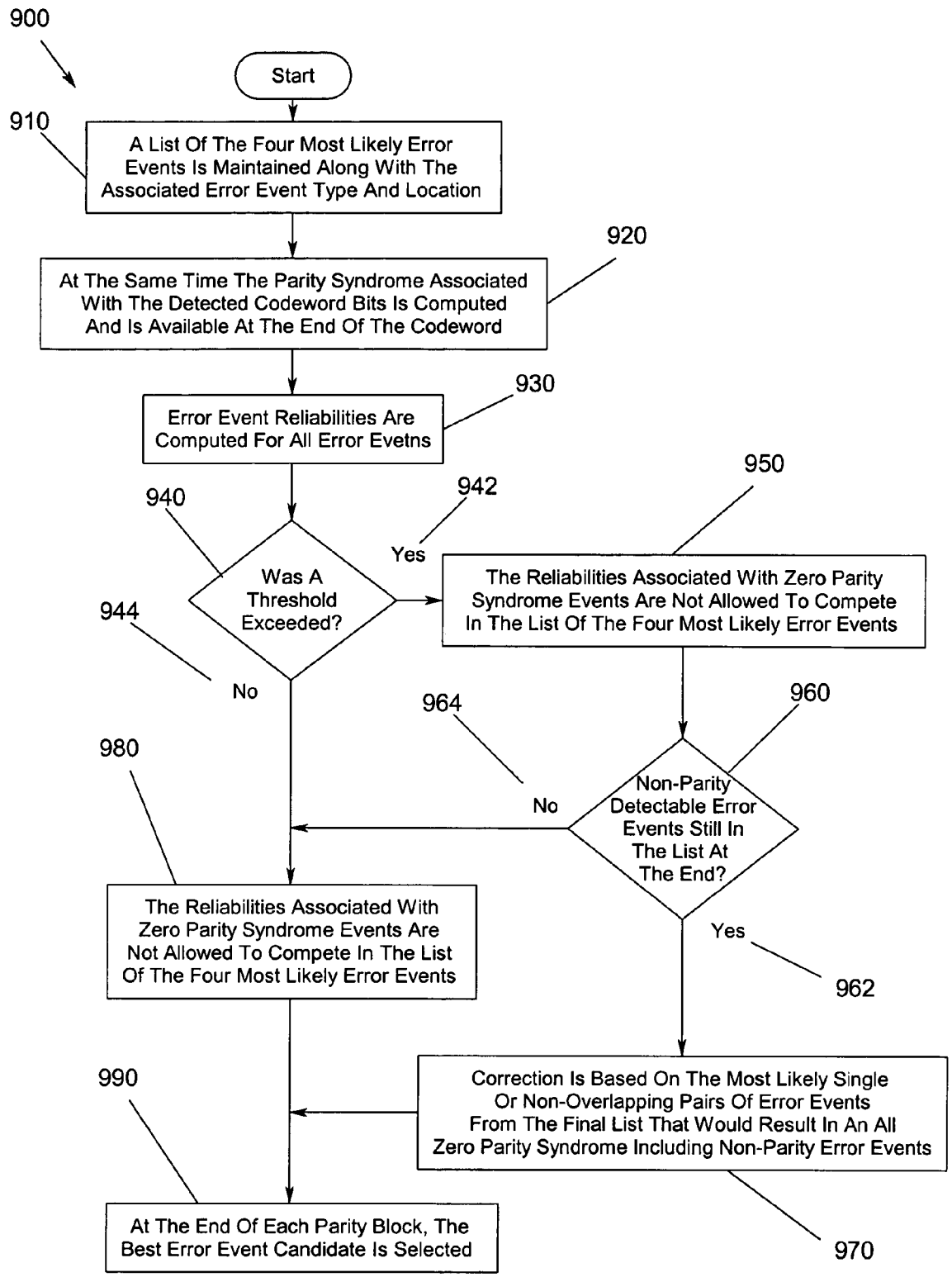
FIG. 9 is a flow chart of the method for the combined parity and non-parity post processing according to an embodiment of the present invention.

FIG. 9 is a flow chart 900 of the method for the combined parity and non-parity post processing according to an embodiment of the present invention. Throughout the processing of each bit, a list of the four most likely error events is maintained along with the associated error event type and location 910. This list is reset at the beginning of each codeword. At the same time the parity syndrome associated with the detected codeword bits is computed and is available at the end of the codeword 920. Error event reliabilities are computed for all error events 930, including zero parity syndrome events, e.g., +− and +0+ errors that cannot be detected with single parity. The likelihood of occurrence for reliabilities associated with zero parity syndrome events is compared to a tunable or selectable threshold 940. The threshold 940 may thus be varied to select an improved post-processor performance, e.g., the threshold may be tuned to optimize the post-processor performance.

If the likelihood of occurrence for reliabilities associated with zero parity syndrome events exceeds the tunable threshold 942, the reliabilities associated with zero parity syndrome events are not allowed to compete in the list of the four most likely error events 950. A determination is made whether non-parity detectable error events are still in the list at the end 960. If yes 962, correction is based on the most likely single or non-overlapping pairs of error events from the final list that would result in an all zero parity syndrome including non-parity error events 970. However, if not 964, the likelihood of occurrence for reliabilities associated with zero parity syndrome events does not exceed the tunable threshold 944, and the reliabilities associated with zero parity syndrome events are not allowed to compete in the list of the four most likely error events 980. At the end of each parity block, the best error event candidate is selected 990. Thus, the combining of parity and non-parity post processing according to an embodiment of the present invention allows for single and double error event correction even when there was no parity error in the codeword. The combining of parity and non-parity post processing according to an embodiment of the present invention also allows for a mix of zero parity syndrome error event correction and non-zero parity syndrome error event correction.

Figure 10:
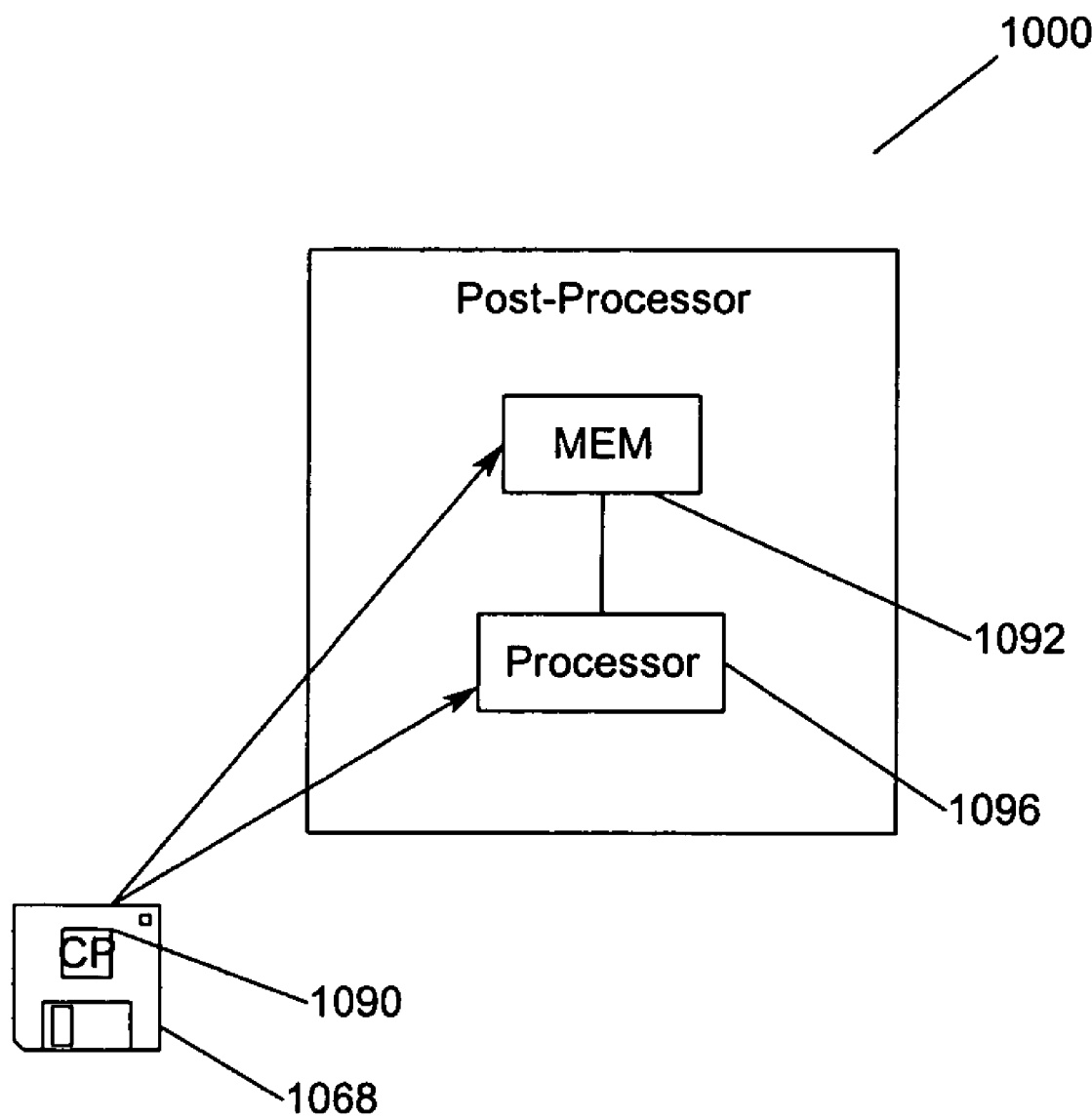
FIG. 10 illustrates a post-processor and a computer-readable medium or carrier for selecting an error sequence according to an embodiment of the present invention.

FIG. 10 illustrates a post-processor 1000 according to the present invention, wherein the process illustrated with reference to FIGS. 1-9 may be tangibly embodied in a computer-readable medium or carrier, e.g. one or more of the fixed and/or removable data storage devices 1068 illustrated in FIG. 10, or other data storage or data communications devices. A computer program 1090 expressing the processes embodied on the removable data storage devices 1068 may be loaded into the memory 1092 to configure the post-processor 1000 of FIG. 10 for execution. The computer program 1090 includes instructions which, when read and executed by the processor 1096 of FIG. 10, cause the processor 1096 to perform the steps necessary to execute the steps or elements of the present invention Accordingly, the combination of parity and non-parity post processing according to an embodiment of the present invention allows for both parity and non-parity corrections and includes error events that cannot be detected by parity. Non-parity detectable error events are only kept for consideration if their likelihood is above a set threshold. Single and double error event correction possible even without any parity error.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A post-processor for selecting an error sequence, comprising:
    memory for storing data therein; and
    a processor, coupled to the memory, the processor being configured for computing, for each processed bit of a codeword, reliabilities associated with each error event, wherein the reliabilities are based on parity and non-parity error events, computing parity syndromes associated with the codeword bits, maintaining a list of most likely error events along with error event type and location including parity events and non-parity events meeting a predetermined criteria based on the computed reliabilities and parity syndromes and selecting an error event having the highest reliability from the list of most likely error events for use in correcting for detected errors, the processor being configured to correct single and double error events even when there is no parity error in the codeword by prioritizing parity error events and non-parity error events meeting a predetermined criteria.

2. The post-processor of claim 1, wherein the processor is further configured to prioritize parity error events and non-parity error events meeting a predetermined criteria by computing a likelihood of occurrence for reliabilities associated with zero parity syndrome events, comparing the likelihood of occurrence to a threshold and including the zero parity events in the list when the likelihood of occurrence for reliabilities associated with zero parity syndrome events exceed a threshold.

3. The post-processor of claim 2, wherein the threshold comprises a threshold having a value that may be changed.

4. The method of claim 1, wherein the processor is further configured to combine zero parity syndrome error event correction and non-zero parity syndrome error event correction.

5. A magnetic storage device, comprising:
    a magnetic storage medium for recording data thereon;
    a motor for moving the magnetic storage medium;
    a head for reading and writing data on the magnetic storage medium;
    an actuator for positioning the head relative to the magnetic storage medium; and
    a data channel for processing encoded signals form the magnetic storage medium, the data channel comprising a post-processor for selecting an error sequence, the post-processor being configured for computing, for each processed bit of a codeword, reliabilities associated with each error event, wherein the reliabilities are based on parity and non-parity error events, computing parity syndromes associated with the codeword bits, maintaining a list of most likely error events along with error event type and location including parity events and non-parity events meeting a predetermined criteria based on the computed reliabilities and parity syndromes and selecting an error event having the highest reliability from the list of most likely error events for use in correcting for detected errors, the post-processor being configured to correct single and double error events even when there is no parity error in the codeword by prioritizing parity error events and non-parity error events meeting a predetermined criteria.

6. The magnetic storage device of claim 5, wherein the processor is further configured to prioritize parity error events and non-parity error events meeting a predetermined criteria by computing a likelihood of occurrence for reliabilities associated with zero parity syndrome events, comparing the likelihood of occurrence to a threshold and including the zero parity events in the list when the likelihood of occurrence for reliabilities associated with zero parity syndrome events exceed a threshold.

7. The magnetic storage device of claim 6, wherein the threshold comprises a threshold having a value that may be varied.

8. The magnetic storage device of claim 5, wherein the processor is further configured to combine zero parity syndrome error event correction and non-zero parity syndrome error event correction.

9. A read channel, comprising:
    an adaptive equalizer for equalizing a received data sequence to a desired target response;
    a Viterbi detector, coupled to the equalizer, for obtaining an estimate of the data sequence; and
    a post-processor, coupled to the Viterbi detector, for selecting an error sequence, the post-processor being configured for computing, for each processed bit of a codeword, reliabilities associated with each error event, wherein the reliabilities are based on parity and non-parity error events, computing parity syndromes associated with the codeword bits, maintaining a list of most likely error events along with error event type and location including parity events and non-parity events meeting a predetermined criteria based on the computed reliabilities and parity syndromes and selecting an error event having the highest reliability from the list of most likely error events for use in correcting for detected errors, the post-processor being configured to correct single and double error events even when there is no parity error in the codeword by prioritizing parity error events and non-parity error events meeting a predetermined criteria.

10. The read channel of claim 9, wherein the processor is further configured to prioritize parity error events and non-parity error events meeting a predetermined criteria by computing a likelihood of occurrence for reliabilities associated with zero parity syndrome events, comparing the likelihood of occurrence to a threshold and including the zero parity events in the list when the likelihood of occurrence for reliabilities associated with zero parity syndrome events exceed a threshold.

11. The read channel of claim 10, wherein the threshold comprises a threshold having a value that may be changed.

12. The read channel of claim 9, wherein the processor is further configured to combine zero parity syndrome error event correction and non-zero parity syndrome error event correction.

13. A post-processor for selecting an error sequence, comprising:
    means for storing data therein; and
    means for processing, coupled to the means for storing data, the means for processing being configured for computing, for each processed bit of a codeword, reliabilities associated with each error event, wherein the reliabilities are based on parity and non-parity error events, computing parity syndromes associated with the codeword bits, maintaining a list of most likely error events along with error event type and location including parity events and non-parity events meeting a predetermined criteria based on the computed reliabilities and parity syndromes and selecting an error event having the highest reliability from the list of most likely error events for use in correcting for detected errors, the means for processing being configured to correct single and double error events even when there is no parity error in the codeword by prioritizing parity error events and non-parity error events meeting a predetermined criteria.

14. A magnetic storage device, comprising:
    means for recording data thereon;
    means for moving the means for recording data;
    means for reading and writing data on the means for recording data;
    means, coupled to the means for reading and writing, for positioning the means for reading and writing relative to the means for storing data; and
    means for computing, for each processed bit of a codeword, reliabilities associated with each error event, wherein the reliabilities are based on parity and non-parity error events, computing parity syndromes associated with the codeword bits, maintaining a list of most likely error events along with error event type and location including parity events and non-parity events meeting a predetermined criteria based on the computed reliabilities and parity syndromes and selecting an error event having the highest reliability from the list of most likely error events for use in correcting for detected errors, the means for computing correcting single and double error events even when there is no parity error in the codeword by prioritizing parity error events and non-parity error events meeting a predetermined criteria.

15. A read channel, comprising:
    means for equalizing a received data sequence to a desired target response;
    means, coupled to the means for equalizing, for obtaining an estimate of the data sequence; and
    means, coupled to the for obtaining an estimate of the data sequence, for computing, for each processed bit of a codeword, reliabilities associated with each error event, wherein the reliabilities are based on parity and non-parity error events, computing parity syndromes associated with the codeword bits, maintaining a list of most likely error events along with error event type and location including parity events and non-parity events meeting a predetermined criteria based on the computed reliabilities and parity syndromes and selecting an error event having the highest reliability from the list of most likely error events for use in correcting for detected errors, the means for computing correcting single and double error events even when there is no parity error in the codeword by prioritizing parity error events and non-parity error events meeting a predetermined criteria.

* * * * *